United States Patent [19]

So et al.

[11] Patent Number: 4,899,067
[45] Date of Patent: Feb. 6, 1990

[54] PROGRAMMABLE LOGIC DEVICES WITH SPARE CIRCUITS FOR USE IN REPLACING DEFECTIVE CIRCUITS

[75] Inventors: Hock-Chuen So, Milpitas; Sau-Ching Wong, Hillsborough, both of Calif.

[73] Assignee: Altera Corporation, Santa Clara, Calif.

[21] Appl. No.: 222,832

[22] Filed: Jul. 22, 1988

[51] Int. Cl.[4] .......................................... H03K 19/003
[52] U.S. Cl. ................................. 307/465; 307/202.1; 307/441; 307/468
[58] Field of Search ...................... 307/202.1, 441, 465, 307/468–469, 219; 364/716; 365/185, 200

[56] References Cited

U.S. PATENT DOCUMENTS

| | | | |
|---|---|---|---|
| 4,380,811 | 4/1983 | Gotze et al. | 307/465 X |
| 4,551,814 | 11/1985 | Moore et al. | 364/716 |
| 4,641,285 | 2/1987 | Sasaki et al. | 307/441 X |
| 4,700,187 | 10/1987 | Furtek | 307/219 X |
| 4,791,319 | 12/1988 | Tagami et al. | 307/441 |

Primary Examiner—David Hudspeth
Attorney, Agent, or Firm—Robert R. Jackson

[57] ABSTRACT

A programmable logic device having a plurality of word lines and a plurality of bit lines, each of which is programmably interconnectable to at least one of the word lines for producing on each bit line a signal which is a logical function of the signal or signals on the word line or lines to which that bit line is interconnected. The logic device further includes at least one spare word line and/or bit line for use in the event that one of the regular lines of the same kind in defective. When the spare line is to be used, the device is preprogrammed to automatically redirect all signals intended for the bad line to another line, thereby putting the spare line into use. The signals thus automatically redirected include both the signals used during program mode to selectively interconnect the word lines and bit lines and the data signals subsequently processed during normal operation of the device.

15 Claims, 9 Drawing Sheets

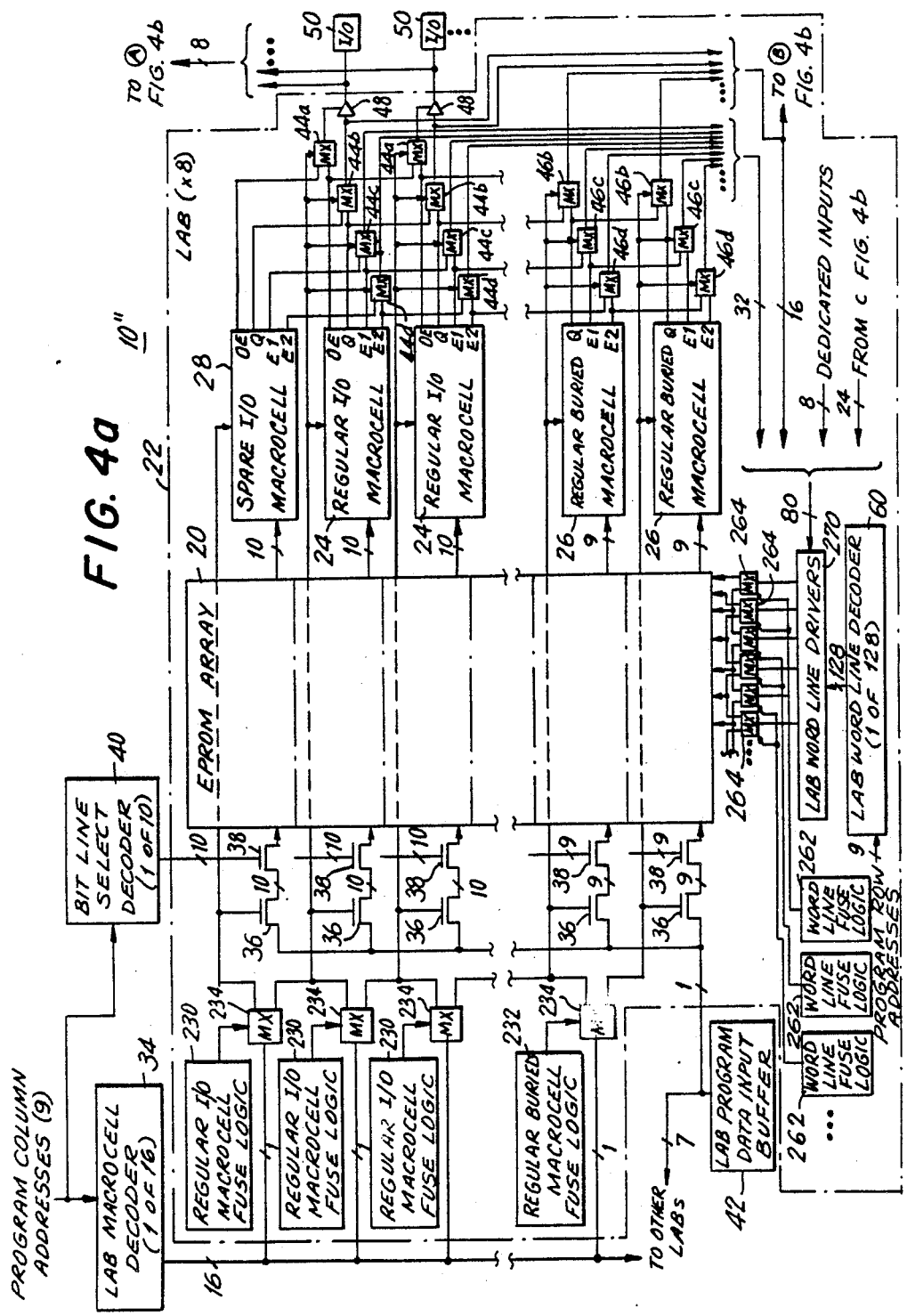

PROGRAMMABLE LOGIC DEVICES WITH SPARE CIRCUITS FOR USE IN REPLACING DEFECTIVE CIRCUITS

BACKGROUND OF THE INVENTION

This invention relates to programmable logic integrated circuits, and more particularly to programmable logic integrated circuits including spare circuits for use in replacing other possibly defectively manufactured circuits on the same chip.

As is shown by such references as Hartmann et al. U.S. Pat. No. 4,617,479; Hartmann et al. U.S. Pat. No. 4,609,986; Veenstra U.S. Pat. No. 4,677,318; Hartmann et al. U.S. Pat. No. 4,713,792; Birkner et al. U.S. Pat. No. 4,124,899; Cavlan U.S. Pat. No. 4,703,206; and Spencer U.S. Pat. No. 3,566,153, all of which are hereby incorporated by reference herein, programmable logic integrated circuits or devices ("PLDs") are well known. PLDs are constantly increasing in size and complexity, so that such devices are now being made with 500,000 or more transistors on a single chip. With so many circuits on a chip, there is always a chance that one or more circuits will be defectively manufactured, thereby rendering the entire chip useless. This reduces the "yield" of the chip manufacturing process and effectively increases the cost of the good chips.

In view of the foregoing, it is an object of this invention to increase the effective yield of PLD manufacturing processes.

It is another object of this invention to make it possible to salvage defectively manufactured PLD chips and convert them to usable devices, preferably so that the repaired chips are just like completely good chips and have all the characteristics, features, performance, and long-term reliability of good chips.

It is a further object of this invention to make it possible to convert defectively manufactured PLD chips to good chips in such a way that the purchaser and ultimate user of the chips is completely unaware that the chip was initially defective.

It is still another object of this invention to provide PLD architectures or circuit configurations which, even if defectively manufactured in some respects, can be reconfigured so that the defects are effectively eliminated or obviated.

SUMMARY OF THE INVENTION

These and other objects of the invention are accomplished in accordance with the principles of the invention by providing programmable logic devices ("PLDs") having spare circuits which can be programmably switched into the architecture of the device to replace any normal circuit which is found to be unusable (e.g., as a result of defective manufacture of the device). This replacement of any defective or bad circuit with a spare circuit is done by "preprogramming" the chip in such a way that the ultimate user of the chip is unaware that the chip has been preprogrammed. This means that after such preprogramming and therefore during all phases of operation of the chip by the ultimate user, the chip automatically reroutes signals throughout the chip to avoid any defective circuit or circuits and to rely on spare circuits instead. During both programming (subsequent to and distinct from the abovementioned preprogramming) and normal operation of the chip, the ultimate user employs the chip exactly as though it had been manufactured with no defects. The use of the spare circuits is therefore completely transparent to the ultimate user.

Further features of the invention, its nature and various advantages will be more apparent from the accompanying drawings and the following detailed description of the preferred embodiments.

BRIEF DESCRIPTION OF THE DRAWINGS

FIGS. 4a and 4b (sometimes referred to collectively as FIG. 4) are a schematic block diagram of another illustrative embodiment of the invention.

DETAILED DESCRIPTION OF THE PREFERRED EMBODIMENTS

Although the invention will be shown and described in the context of particular PLD architectures, it will be understood that PLDs vary greatly in size and architecture. Thus the embodiments shown and described herein are merely illustrative of PLD architectures in which the invention can be employed. The invention is equally applicable to PLDs having many other architectures, including those which do not have some of the features of the depicted embodiments and those which have features additional to those of the depicted embodiments.

Figure 3B:
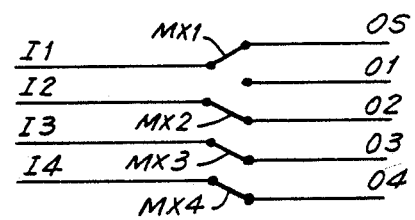
FIGS. 3a–3c (sometimes referred to collectively as FIG. 3) are simplified wiring diagrams useful in explaining the operation of portions of FIG. 4.
Figure 4B:
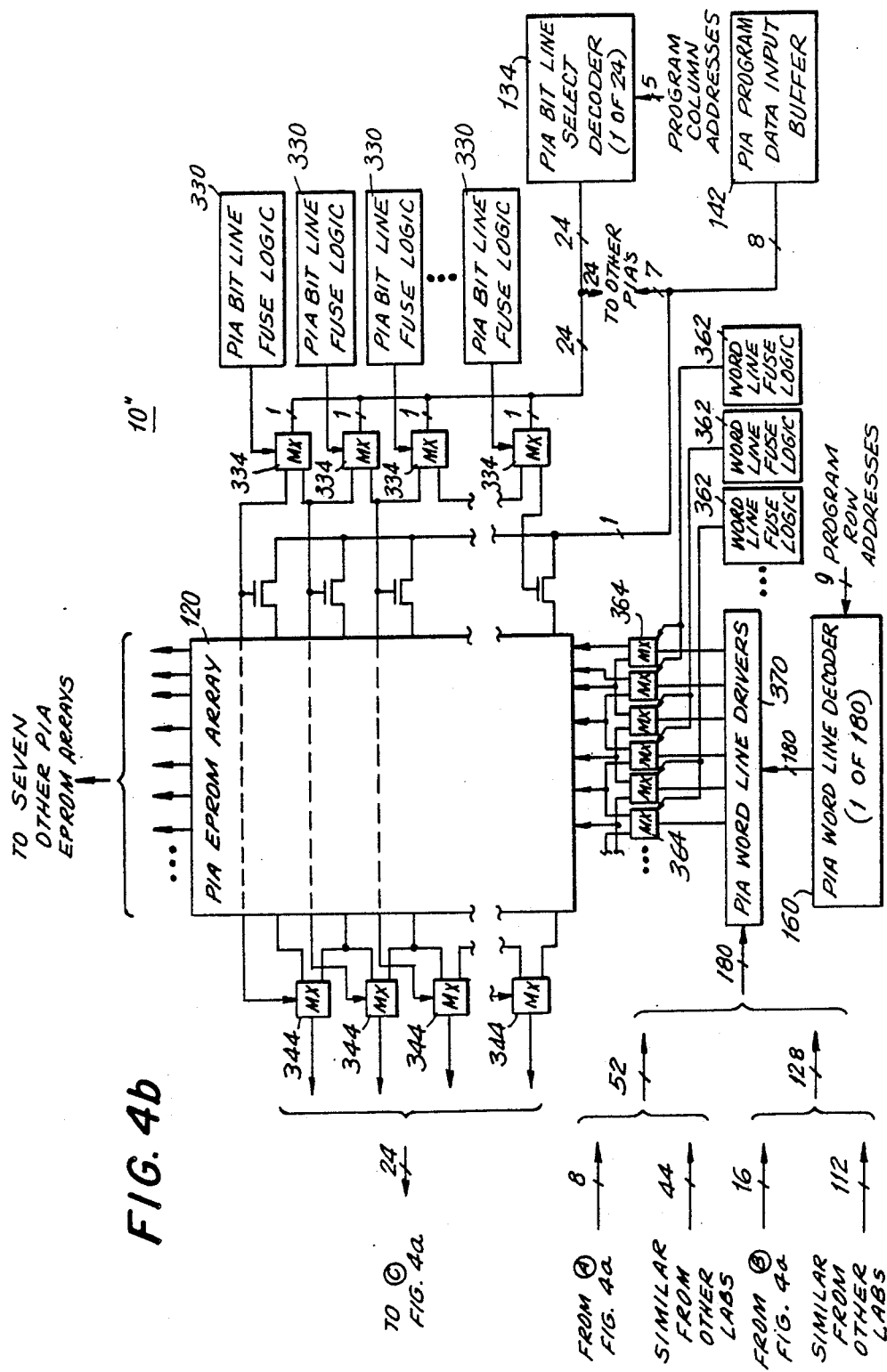
Figure 5:
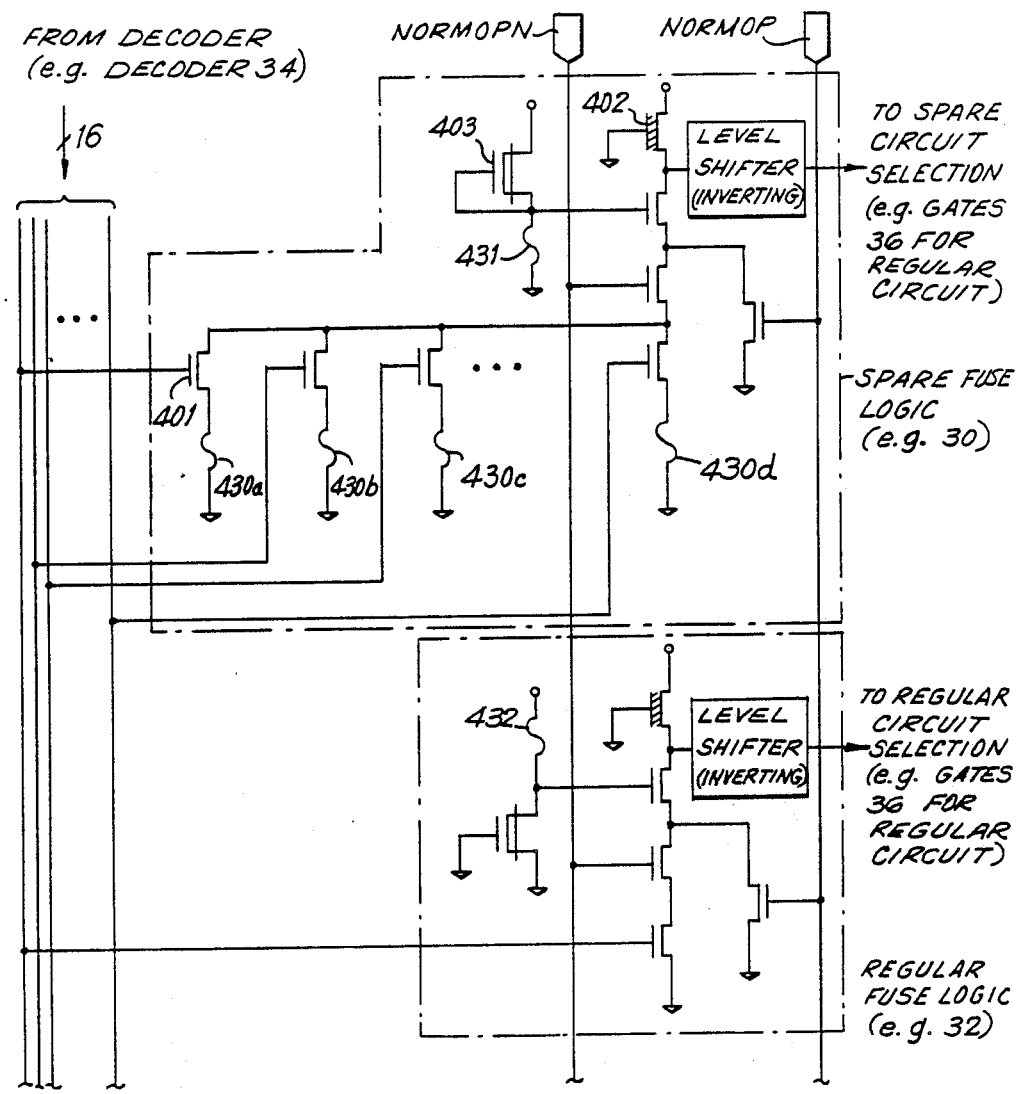
FIGS. 5–7 are schematic diagrams of circuits which can be used to implement portions of the embodiment shown in FIG. 1.

The PLD circuitry shown in FIG. 1 includes part of the circuitry for the PLD shown in FIGS. 3–5 of co-pending, commonly assigned U.S. patent application Ser. No. 190,663, which is hereby incorporated by reference herein. In other words, FIG. 1 shows one way in which the subject matter of the present invention can be added to or implemented in the context of the PLD shown in FIGS. 3–5 of application Ser. No. 190,663. For convenience, the PLD shown in FIGS. 3–5 of application Ser. No. 190,663 will be referred to herein as PLD 10, and the modified version of that PLD shown in FIG. 1 of this application will be referred to as PLD 10′. All reference numbers employed in this specification are those appearing in the accompanying drawings unless otherwise specifically noted.

As is well known to those skilled in the art, PLD 10 has two primary modes of operation of interest to the end user. These are the "program mode" (not to be confused with "preprogramming", which is used in accordance with the present invention to replace bad circuits with spare circuits) and the "normal operation mode." The program mode is employed by the end user to program the programmable elements in the PLD (e.g., (1) the programmable interconnections between the (horizontal) P-terms or bit lines and the (vertical) word lines in EPROM array 20, (2) the programmable interconnections between the (horizontal) bit lines and the (vertical) word lines in programmable interconnect array ("PIA") EPROM array 120, and (3) any programmable architecture bits employed in the PLD). After the PLD has been programmed, it can be used as a logic device in the normal operation mode. (Although this specification contemplates that there are (1) PLD "manufacturers" who make and, if necessary, preprogram PLDs in accordance with this invention, and (2) "end users" (or simply "users") who buy PLDs from manufacturers and then program and use those PLDs, it will be understood that the chain of distribution and use may be different from this, and that such differences are of no consequence to the present invention. For example, the manufacturer may also be asked to program the PLDs, or the end user may actually be two different parties, one of whom programs the PLDs and then sells them to the other party who actually uses them as logic devices.)

U.S. Pat. No. 4,617,479 contains a good description of the basic operation of PLDs in the program and normal operation modes. This description is applicable to all of the PLDs shown and described herein and need not be repeated here. For present purposes, it will be sufficient to consider the architecture and operation of PLD 10 (or PLD 10') at a somewhat higher level as follows.

Figure 1A:
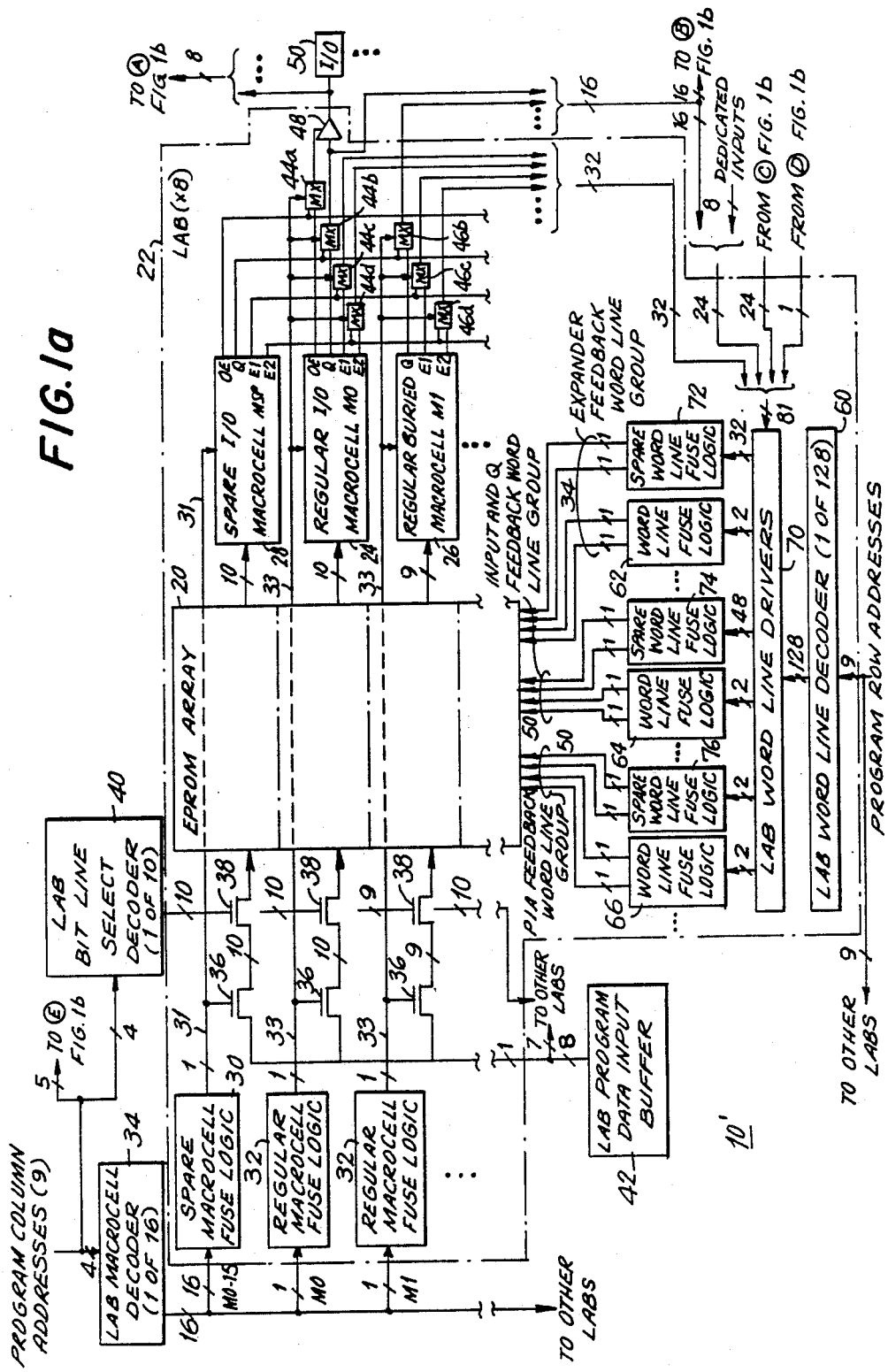
FIGS. 1a and 1b (sometimes referred to collectively as FIG. 1) are a schematic block diagram of an illustrative embodiment of the invention.
Figure 1B:
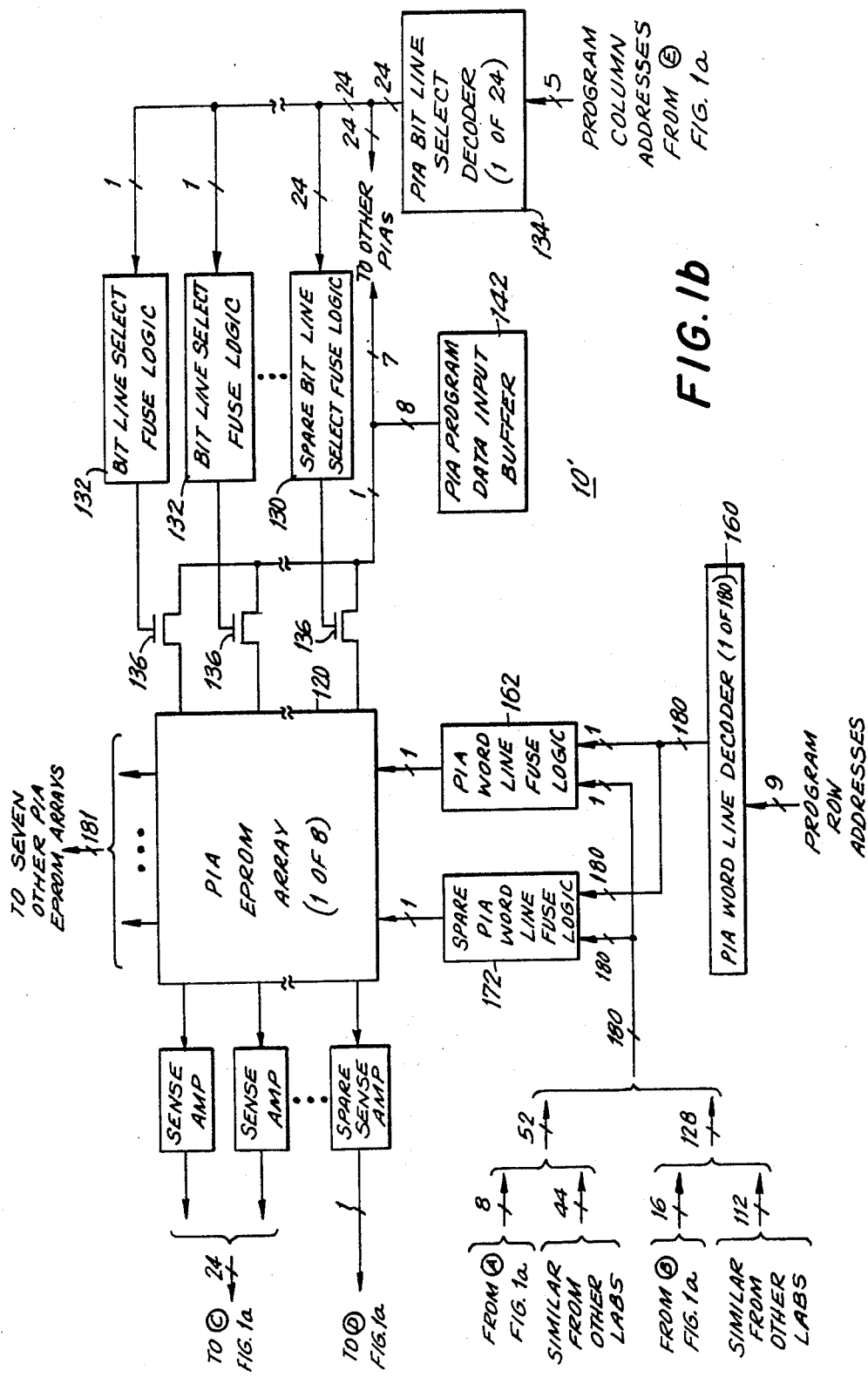

As in the case of PLD 10, PLD 10' includes eight logic array blocks ("LABs") 22 (one of which is shown in FIG. 1a) and eight PIA EPROM arrays 120 (one of which is shown in FIG. 1b). In addition to eight regular I/O macrocells 24 and eight regular buried macrocells 26 as in the case of PLD 10, each LAB 22 in PLD 10' has a spare I/O macrocell 28 which can be used as a direct replacement for any defective regular macrocell 24 or 26 (and the associated bit lines in EPROM array 20) in that LAB. This is accomplished as follows.

Normally, spare fuse logic 30 is preprogrammed so that during program mode none of the output signals of conventional LAB macrocell decoder 34 causes selection of the output signal 31 of element 30. (As is conventional, during program mode, decoder 34 produces an output signal on one of its 16 output lines to cause selection of a respective one of the 16 segments of EPROM array 20 associated with a respective one of the 16 regular macrocells 24 and 26. The selected EPROM array segment is the one addressed by the four program column address bits applied to decoder 34 in the conventional way.) Also in the normal case, each of regular fuse logics 32 (of which there are 16, one for each regular macrocell 24 and 26) is preprogrammed to pass the applied selection output signal of decoder 34 to the associated output lead 33. When a selection output signal is passed by any one of fuse logics 30 and 32, the pass gate 36 connected to that fuse logic output lead 31 or 33 is enabled. In addition, one of the nine or ten pass gates 38 associated with each of the segments of EPROM array 20 is enabled in the conventional way by conventional bit line select decoder 40, which selects one of its ten outputs by decoding the applied four program column address bits. Thus, in the normal case, the combined effect of the selections performed by decoders 34 and 40 is to select one bit line in the portion of EPROM array 20 associated with regular macrocells 24 and 26. Note that as is conventional, at the same time that one bit line is being selected in depicted LAB 22, the corresponding bit line is also being selected in all of the other LABs on the chip. (It will be appreciated that other configurations are possible in which more than one bit line is selected at a time.)

As will be discussed in greater detail below, at the same time that a bit line is being selected by decoding the program column address, one of the (vertical) word lines in EPROM ARRAY 20 is being selected by decoding the program row address. In this way, a single interconnection between a (horizontal) bit line and a (vertical) word line is selected for programming. Then, as is conventional, one data bit from conventional LAB program input buffer 42 is applied to the selected bit line in LAB 22. The level of this signal (i.e., whether it is logic 1 or logic 0) determines whether or not the programmable device at the selected interconnection is "programmed" (i.e., whether or not a connection is established at that point between the selected bit line and the selected word line). At the same time, buffer 42 applies a different data bit to each of the seven other LABs on the chip to appropriately program the corresponding interconnection in all of the other LABs.

Still in the normal case (no defective bit lines or regular macrocells 24 and 26), after all of the interconnections in all of the LAB EPROM arrays 20 have been appropriately programmed (and after other devices on the chip have also been programmed as discussed below), PLD 10' can be used in the normal operation mode as a logic device for forming the programmed logical combinations of the signals applied to the (vertical) word lines of EPROM arrays 20. Note that during operation of the device in the normal operation mode, and assuming that there are no defective bit lines or regular macrocells, all of the outputs 33 of fuse logics 32 are selected. These signals enable the associated regular macrocell logic 24 and 26 and multiplexers 44 and 46. Spare macrocell 28 is not enabled. The output signals of decoder 40 are low, thereby disabling pass gates 38.

Considering further the normal operation mode, if spare macrocell 28 has not been put into use, then the output signals 33 of fuse logics 32 enable all of macrocells 24 and 26 (e.g., by enabling the sense amplifiers in those macrocells), and also control all of multiplexers 44 and 46 to pass the output signals of the associated regular macrocells 24 and 26. Thus, for example, multiplexer 44a applies the OE (output enable) output signal of depicted regular I/O macrocell 24 to the control terminal of output buffer 48 to control whether or not the Q (data) output signal of macrocell 24 (passed by multiplexer 44b) is applied to I/O (input/output) pad 50 and to PIA 120 in FIG. 1b. Similarly, multiplexers 44b, 44c and 44d apply the Q, E1 (expander 1), and E2 (expander 2) output signals of macrocell 24 to selected word lines of EPROM array 20 in the manner described in more detail below. In the case of depicted buried macrocell 26, multiplexer 46b applies the Q output signal of that macrocell to selected word lines of EPROM array 20 and also to selected word lines of PIA 120 for possible application (via the PIA) to the word lines of other LABs on the chip. Similarly, multiplexers 46c and 46d apply the E1 and E2 output signals of macrocell 26 to selected word lines of EPROM array 20.

If, rather than being normal, one or more of the bit lines in EPROM array 20 for one of regular macrocells 24 or 26 is found to be defective, or if one of regular macrocells 24 or 26 is found to be defective, then fuse logics 30 and 32 are preprogrammed to divert the output signal of decoder 34 that would normally select the (horizontal) group of circuits containing the bad circuit or circuits to cause selection of the spare (horizontal) group of circuits instead. In particular, the fuse logic 32 associated with the bad circuit group is preprogrammed (e.g., by using a laser to opto-thermally "burn out" a fuse in that fuse logic 32) to interrupt the circuit path through that fuse logic from decoder 34 to the associated pass gate 36. (Although preprogramming control elements like 30 are generally referred to herein as fuse logic, it will be apparent to those skilled in the art that these elements can comprise fuses, antifuses, EPROM transistors, EEPROM transistors, or any other type of memory devices. The same is true of elements like 32, 62, 64, 66, 72, 74, 76, 130, 132, 162, 172, and the generally corresponding elements in FIG. 4.) At the same time, fuse logic 30 is preprogrammed (e.g., again by using a laser to opto-thermally burn out fuses in fuse logic 30) to make a connection between (1) the output of decoder 34 which would normally select the bad circuit group and (2) the pass gate 36 associated with spare macrocell 28. In this way, the bit lines in EPROM array 20 associated with spare macrocell 28 are automatically selected instead of the bit lines of the bad circuit group whenever decoder 34 would otherwise select the bad circuit group. During program mode, this causes the bit lines associated with spare macrocell 28 to be programmed instead of the bit lines in the bad circuit group. And during normal operation mode, the state of fuse logic 30 causes spare macrocell 28 and its associated bit lines to be enabled in place of the bad circuit group. The state of the fuse logic associated with the bad macrocell disables the bad macrocell and its associated bit lines.

Thus, if spare macrocell 28 is in use, then the output signal of fuse logic 30 enables spare macrocell 28, and the output signal of the fuse logic 32 associated with the macrocell 24 or 26 being replaced disables that macrocell 24 or 26 and controls the multiplexers 44 or 46 associated with that macrocell to substitute the OE, Q, E1, and E2 output signals of spare macrocell 28 for the OE (if any), Q, E1, and E2 output signals of the macrocell 24 or 26 being replaced. For example, if depicted regular I/O macrocell 24 or its bit lines were bad, then spare macrocell 28 and its bit lines would be used to replace that regular macrocell. Multiplexer 44a would apply the OE output signal of spare macrocell 28 (rather than the OE output signal of replaced macrocell 24) to output buffer 48. Similarly, multiplexer 44b would apply the Q output signal of spare macrocell 28 (rather than the Q output signal of replaced macrocell 24) to output buffer 48. And multiplexers 44c and 44d would apply the E1 and E2 output signals of spare macrocell 28 (rather than the E1 and E2 output signals of replaced macrocell 24) to the word lines of EPROM array 20. Similar output signal substitution would occur via multiplexers 46 if spare macrocell 28 were being used to replace a regular buried macrocell 26 (except that the OE output signal of spare macrocell 28 would not be used because macrocell 26 does not have an OE output signal).

From the foregoing it will be seen that once fuse logics 30 and 32 have been preprogrammed as described above, those elements (and possibly others such as multiplexers 44 and 46) operate both during the program mode and the normal operation mode to automatically redirect programming data and normal operation data from any bad bit line or macrocell circuit group to spare macrocell 28 and its associated spare bit lines. These spare circuits therefore completely replace the bad circuits, and it is not necessary for the user (who is either programming PLD 10' or using it as a logic device) to know how it has been reconfigured during preprogramming. Illustrative circuits for implementing fuse logics like fuse logic 30 and 32 are shown in FIG. 5 and described below.

In the depicted preferred embodiment, the entire macrocell is replaced when any associated bit line or macrocell component is found to be bad. This approach is preferred because (1) fewer fuse logic devices 32 and multiplexers 44 and 46 are required, and (2) because circuit replacement on this basis repairs any defect in the macrocell as well as in array 20. It will be apparent to those skilled in the art, however, that the principles described above are equally applicable to replacing single bit lines rather than whole macrocell groups if that approach is preferred for any reason.

A similar technique can be used in accordance with the invention to replace bad (vertical) word lines in EPROM array 20. In the illustrative embodiment shown in FIG. 1, the word lines in EPROM array 20 are treated in three groups: (1) 32 regular and two spare word lines associated with the 32 expander feedbacks E1 and E2; (2) 48 regular and two spare word lines associated with the 16 Q feedbacks and eight dedicated inputs (referred to as "fast inputs" in application Ser. No. 190,663; and (3) 48 regular and two spare word lines respectively associated with the 24 regular and one spare output from PIA 120. (Note that each expander feedback is applied to only one word line, but that for each of the other word line inputs the "true" version of that input is applied to one word line and the "complement" version of that input is applied to another word line.) The spare word line pair in each group can be used to replace any other pair of word lines in that group found to contain a defect.

During program mode, LAB word line decoder 60 (which is conventional) decodes the applied nine program row address bits to select a single one of its 128 outputs. (Note that the same word line is simultaneously selected in the EPROM array 20 of all eight LABs 22.) Assuming that none of the word lines have been found to be bad, this selects one of the 128 regular word lines to be programmed (at the intersection with the selected bit line) with the data from buffer 42 as described above. In other words, if none of the word lines are bad, regular word line fuse logics 62, 64, and 66 pass the selection output signal of decoder 60 to cause selection of the intended regular word line, while spare word line fuse logics 72, 74, and 76 block all such decoder output signals. If, however, an expander feedback word line has been found to be bad, then the fuse logic 62 associated with that bad word line is preprogrammed to block the decoder 60 output signal that would normally select that word line, and spare word line fuse logic 72 is correspondingly preprogrammed to allow that decoder output signal to select the spare word lines associated with element 72. Similarly, if a word line or word line pair associated with one of the Q feedbacks or dedicated inputs is bad, then the fuse logic 64 associated with that bad word line pair is preprogrammed to block the decoder 60 output signals that would normally select either of those word lines, and spare word line fuse logic 74 is correspondingly preprogrammed to allow those decoder output signals to select the spare word lines associated with element 74. Finally, if a word line or word line pair associated with one of the PIA outputs is bad (or if the PIA bit line that would normally produce that output is bad), then the fuse logic 66 associated with that bad word line pair (or with that bad PIA bit line) is preprogrammed to block the decoder 60 output signals that would normally select either of those word lines, and spare word line fuse logic 76 is correspondingly preprogrammed to allow those decoder output signals to select the spare word lines associated with element 76.

Once preprogrammed as described above, fuse logics 62, 64, 66, 72, 74, and 76 all operate during normal operation mode in basically the same way that they operate during program mode. Thus, if none of the spare word lines is in use, all of fuse logics 62, 64, and 66 pass the applied expander feedbacks, Q feedbacks, dedicated inputs, or PIA outputs to the usual regular word lines. If, however, the spare word lines associated with fuse logic 72 are in use, that fuse logic passes the expander feedbacks that are blocked by one of fuse logics 62 to the spare word lines associated with logic 72. Similarly, if the spare word lines associated with fuse logic 74 are in use, that fuse logic passes the Q feedback or dedicated input that is blocked by one of fuse logics 64 to the spare word lines associated with logic 74.

The spare word line fuse logic 76 for the PIA word line group is slightly different from the other spare word line fuse logics 72 and 74. No multiplexers are needed to divert the PIA output that would normally appear on the line leading to the bad word line pair to the spare word line pair. The spare word line pair is associated with the output from the spare sense amplifier in FIG. 1b. If this spare word line pair is in use, PIA 120 is also preprogrammed so that the PIA output that would normally appear on the line driven by the normal sense amplifier appears instead on the line driven by the spare sense amplifier, which in turn drives the spare word line pair in EPROM array 20 through LAB word line drivers 70 and spare word line fuse logic 76.

Any spare word lines that are not in use and any bad word lines are grounded during normal operation.

Figure 6:
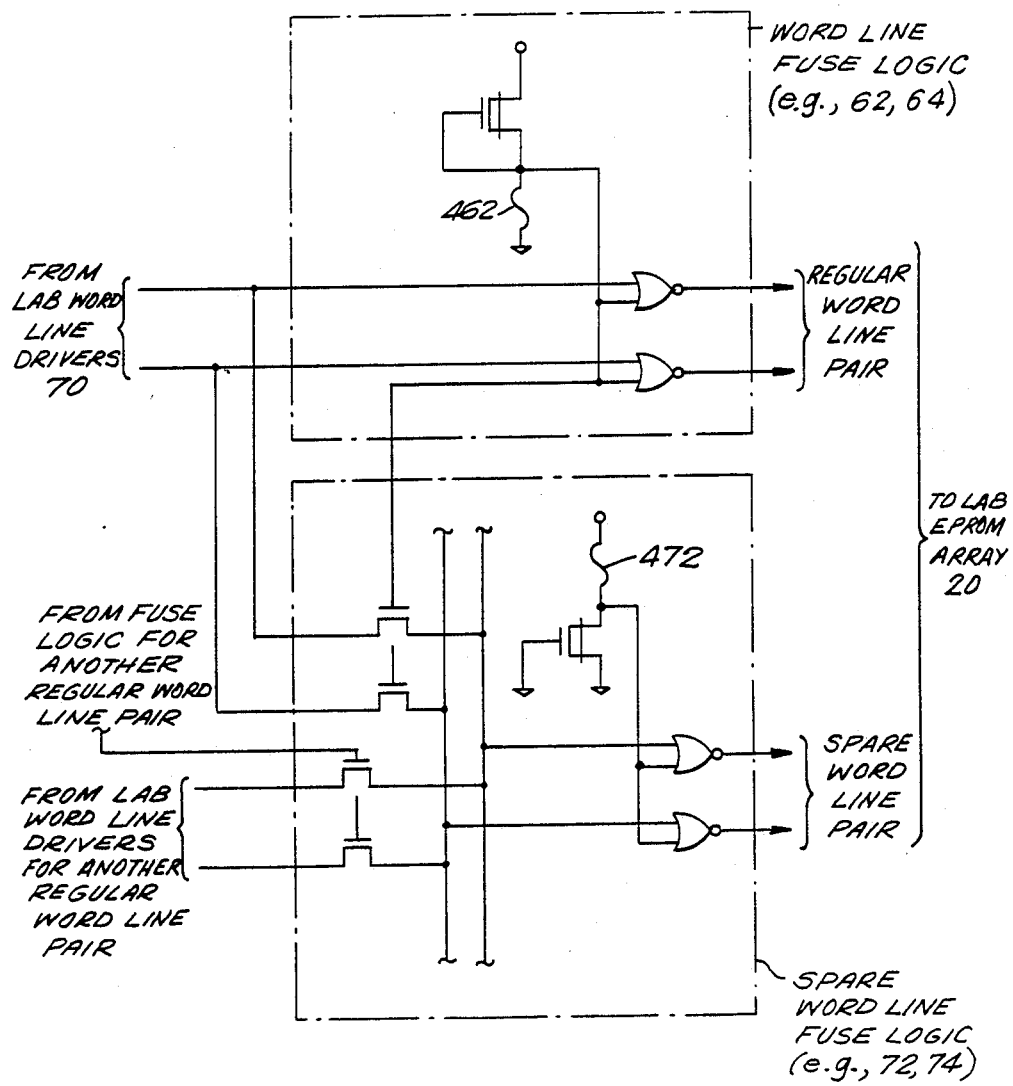
Figure 7:
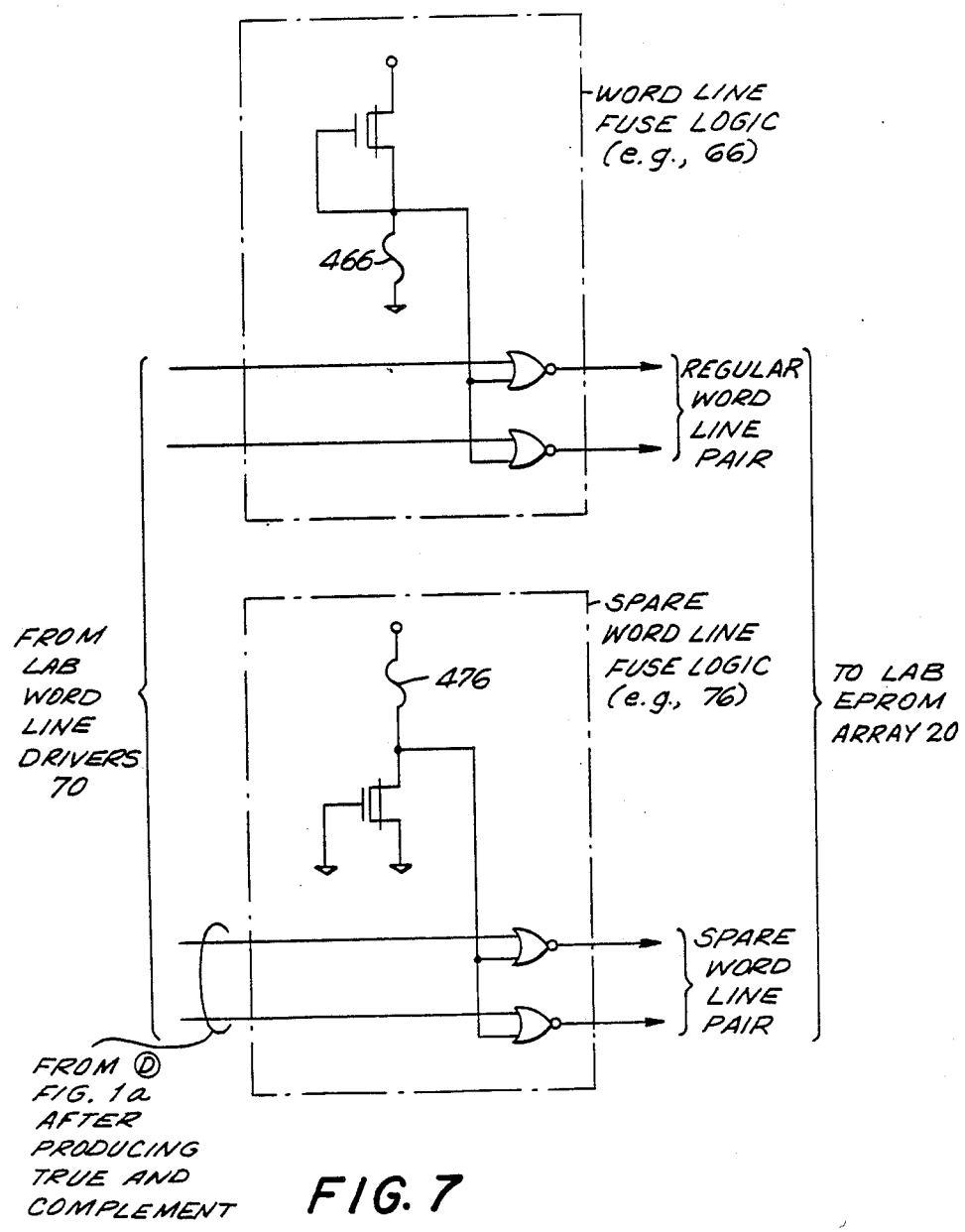

From the foregoing it will be apparent that fuse logics 62, 64, and 66 can be generally similar to fuse logics 32, and that fuse logics 72, 74, and 76 can be generally similar to fuse logic 30. It will also be apparent from the foregoing that once the apparatus of this invention (e.g., fuse logics 62, 64, 66, 72, 74, and 76, etc.) has been preprogrammed as described above, it operates during both the program mode and the normal operation mode to automatically redirect program data and normal operation data from bad word lines in EPROM array 20 to spare word lines in that array. It is not necessary for the user (who is either programming the device or using it as a logic device) to know how it has been effectively reconfigured during preprogramming. Nor does the user have to take such reconfiguration into account in any way. Illustrative circuits for implementing fuse logics like fuse logic 62, 64, 66, 72, 74, and 76 are shown in FIGS. 6 and 7 and described below.

Although in the depicted embodiment only one spare macrocell and bit line group is provided in each LAB 22, it will be apparent to those skilled in the art that more than one such spare group could be provided if desired. Similarly, although only one spare word line pair is shown in each word line group in EPROM array 20, it will be apparent to those skilled in the art that more spare word lines could be provided if desired. Also different ways of grouping the word lines and/or different numbers of word line groupings could be employed if desired. Similarly, bad word lines could be replaced on an individual basis rather than on the above-described pairwise basis.

PIA 120 is a device similar to EPROM array 20. In accordance with this invention it has a spare (horizontal) bit line in case one of its 24 regular bit lines is found to be bad, and it also has a spare (vertical) word line in case one of its 180 regular word lines (single polarity only) is found to be bad. (Although only one spare PIA bit line and one spare PIA word line are provided in the depicted embodiment, it will be understood that more than one of either or both types of spare lines could be provided if desired. Also note that the reason there are eight inputs to the PIA from point A in FIG. 1a, but only 44 similar inputs from the seven other LABs, is that as shown in application Ser. No. 190,663, four of the LABs have eight I/O pad connections each, while the other four LABs have only five I/O pad connections each. The spare PIA bit line is selected (if needed) in the same way that spare macrocell 28 and its associated bit lines are selected as described above. Spare bit line select fuse logic 130 is therefore similar to fuse logic 30, and each of bit line select fuse logics 132 is similar to fuse logics 32. Accordingly, fuse logics 130 and 132 are preprogrammed (similar to the preprogramming of fuse logics 30 and 32) so that if one of the regular PIA bit lines is bad, the signal from decoder 134 (similar to decoder 34) that would normally select the bad bit line is blocked by the associated fuse logic 132 but passed by fuse logic 130 to cause selection of the spare bit line instead of the bad bit line. Then, during program mode, data from PIA program data input buffer 142 (similar to buffer 42) which would have been written into the PIA at the intersection of the bad bit line and the word line selected as described below, is instead written into the PIA at the intersection of the spare bit line and the selected word line. Thereafter, during normal operation, all of the pass gates 136 controlled by the outputs of decoder 134 are deselected. The PIA output that would have been produced on the bad bit line is instead produced on the spare bit line. As has been mentioned, whenever the spare PIA bit line is in use, fuse logics 66 and 76 are preprogrammed to feed that PIA output into the spare pair of word lines in EPROM array 20 associated with logic 76.

The spare PIA word line is similarly selected (if needed) in the same way that spare word lines in EPROM array 20 are selected as described above. Regular PIA word line fuse logics 162 are therefore generally similar to fuse logics 62, for example, and spare PIA word line fuse logic 172 is generally similar to fuse logic 72, for example. Accordingly, fuse logics 162 and 172 are preprogrammed (similar to the preprogramming of fuse logics 62 and 72) so that if one of the regular PIA word lines is bad, the signal from decoder 160 (similar to decoder 60) that would normally select the bad word line is blocked by the associated fuse logic 162 but passed by fuse logic 172 to cause selection of the spare word line instead of the bad word line. During program mode this causes data from buffer 142 which would have been written into the PIA at the intersection of the bad word line and the bit line selected as described above, to be written instead into the PIA at the intersection of the spare word line and the selected bit line. Thereafter, during normal operation, the data signal (from FIG. 1a or other LABs) that would have been applied to the bad PIA word line is instead applied to the spare PIA word line. The bad word line is always grounded.

From the foregoing, it will be seen that just as in LAB 22, once the apparatus shown in FIG. 1b has been preprogrammed, both program data and normal operation data are automatically rerouted from bad circuits to spare circuits, and the user (whether during program mode or normal operation mode) does not have to be concerned in any way with the manner in which the device has been preprogrammed.

Figure 2A:
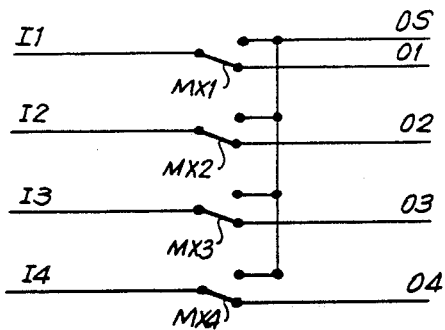
FIGS. 2a and 2b (sometimes referred to collectively as FIG. 2) are simplified wiring diagrams useful in explaining the operation of portions of FIG. 1.
Figure 2B:
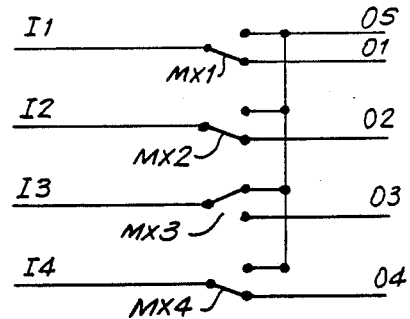

In the embodiment shown in FIG. 1, each spare circuit group is used as a direct replacement for the associated bad circuit group. In other words, the signals intended for any bad circuit group are redirected to the spare circuit group. This "direct" type of bad circuit replacement is shown in simplified form in FIGS. 2a and 2b. In FIG. 2a each of the four inputs I1-I4 is normally connected to a respective one of regular outputs O1-O4, and spare output OS is not used. However, if any one of outputs O1-O4 is bad (e.g., output O3 as shown in FIG. 2b), the multiplexer (e.g., MX3) for the bad output is reconfigured during preprogramming to route the input signal (e.g., I3) that would normally go to the bad output to spare output OS. (Note that in any of FIGS. 2 and 3 the direction of information flow could be reversed, making inputs I1-I4 outputs and outputs O1-O4 and OS inputs.)

One possible shortcoming of the foregoing "direct replacement" technique is that the spare circuit may be slower than the other circuits due to the fact that it is connectable to all of the other circuits (greater circuit loading) and because it may have a significantly longer path length than the other circuits. An alternative technique (so-called "shifting replacement") which does not have this possible disadvantage is illustrated in concept in FIG. 3 and shown in detail in FIG. 4.

Figure 3A:
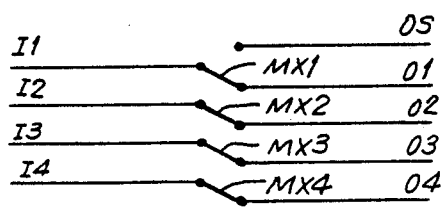
Figure 3C:
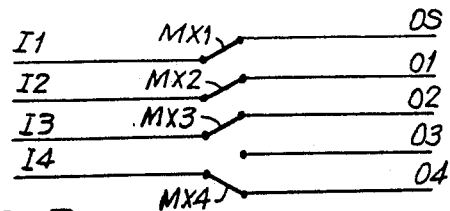

FIG. 3a shows the normal configuration of the circuit elements in the "shifting replacement" alternative. Each of inputs I1-I4 is connected to a respective one of regular outputs O1-O4, and spare output OS is not used. If any one of regular outputs O1-O4 is bad, all of the multiplexers from the bad output and up change position, while the other multiplexers remain unchanged. For example, in FIG. 3b regular output O1 is bad. Multiplexer MX1 therefore switches to connect I1 to OS, while multiplexers MX2-MX4 remain unchanged. This diverts the signal from I1 to OS and cuts O1 out of the circuit completely. As another example (shown in FIG. 3c), assume that O3 is bad. Then multiplexers MX1-MX3 all switch, and only MX4 remains unchanged. OS now receives the signal from I1, O1 receives the signal from I2, and O2 receives the signal from I3. Only O4 continues to receive its regular input signal I4. Note that as compared to FIG. 2, in FIG. 3 no one circuit has loading which is inordinately greater than the others, and (assuming the elements are arranged generay in an ordered sequence as shown) all circuits have approximately the same path length regardless of the states of the multiplexers. These may be advantages of the "shifting replacement" technique of FIG. 3 as compared to the "direct replacement" technique of FIG. 2 (and FIG. 1).

FIG. 4 shows how shifting replacement can be applied to PLD 10. (The FIG. 4 embodiment of PLD 10 is referred to herein as PLD 10".) In FIG. 4 elements which are the same as or substantially the same as elements in FIG. 1 have the same reference numbers. Elements which are substantially different from elements shown in FIG. 1 have three-digit reference numbers whose first digit is 2 (FIG. 4a) or 3 (FIG. 4b).

If none of regular macrocells 24 and 26 or their associated bit lines in EPROM array 20 have been found to be bad, all of fuse logics 230 and 232 are preprogrammed to control multiplexers 234 so that the selection signals from decoder 34 are applied to the gates 36 associated with the regular macrocell bit lines. In particular, each of multiplexers 234 can be thought of as a switch positioned in the downward direction. All of multiplexers 44 and 46 are also positioned in the downward direction. Accordingly, spare macrocell 28 and its associated bit lines are not used in either the program mode or the normal operation mode.

If any regular macrocell 24 or 26 or the associated bit lines are bad, then the fuse logic 230 or 232 associated with that bad circuit group, and all fuse logics 230/232 (if any) above that fuse logic, are preprogrammed to the opposite state. This causes the multiplexers 234, 44, and 46 associated with those fuse logics to switch to the other (upper) position. For example, if the uppermost regular I/O macrocell 24 in FIG. 4a is bad, the uppermost fuse logic 230 is preprogrammed to the opposite (non-normal) state. This causes the uppermost multiplexer 234 to switch and apply the selection signal from decoder 34 to the gates 36 for spare macrocell 28 rather than to the gates 36 for the uppermost regular I/O macrocell 24. All of the other fuse logics 230 and 232 remain in their normal states, so that all of the other multiplexers 234 also remain in their normal states. As a result of the foregoing preprogramming, no selection signals are ever applied to the gates 36 associated with the bad uppermost regular I/O macrocell 24. On the output side, the absence of the selection signal causes the multiplexers 44 associated with the bad uppermost regular macrocell to switch to their upper positions so that the outputs of spare macrocell 28 replace the outputs from the bad regular macrocell. As another example, if the bad macrocell were the next-to-topmost regular I/O macrocell, then (1) the top two fuse logics 230 would be preprogrammed to the non-normal state, (2) the top two multiplexers 234 would switch to their upper positions, (3) the signals normally applied to the topmost regular circuit group would be diverted to the spare circuit group, (4). the signals normally applied to the next-to-topmost regular circuit group would be diverted to the topmost regular circuit group, and (5) on the output side the top two groups of multiplexers 44 would switch to their non-normal (upper) positions so that the outputs of spare macrocell 28 would appear as though they were the outputs of the topmost regular macrocell 24 and the outputs of the topmost regular macrocell 24 would appear as though they were the outputs of the next-to-topmost regular macrocell 24. Once again, the bad bit line/macrocell circuit group is effectively eliminated from the circuit. The necessary rerouting of signals described above is effective during both the program mode and the normal operation mode, and the ultimate user of the device requires no knowledge of it.

Shifting replacement like that described above is also used for the (vertical) word lines of EPROM array 20 in FIG. 4a. (Only one group of word lines is shown in FIG. 4a, but the word lines could be grouped as shown in FIG. 1a.) For illustrative purposes the rightmost two word lines are assumed to be the two spare word lines. If none of the word lines are bad, then all of fuse logics 262 are preprogrammed in the normal state so that each of multiplexers 264 is controlled to convey the applied signal to its left-hand output. The two spare word lines are therefore not used. However, if any word line or word line pair is bad, then the word line fuse logic 262 associated with that pair, and all fuse logics 262 to the right of that fuse logic, are preprogrammed to the non-normal state. This causes the multiplexers 264 controlled by those fuse logics to switch so that they convey the applied signal to their right-hand output. This effectively cuts the bad word line pair out of the circuit during both the program mode and the normal operation mode so that the end user need not be concerned at all by the fact that the chip has been effectively preprogrammed. (LAB word line drivers 270 are merely the conventional word line drivers which, during program mode, apply each of the 128 output signals of decoder 60 to a respective one of the EPROM array word lines (selected by multiplexers 264) and which, during normal operation mode, apply (1) each of the 32 expander feedback signals (single-polarity only) to a respective one of 32 word lines, and (2) each of the 48 other Q feedback, etc., signals (true and complement) to a respective pair of 96 other word lines (again selected by multiplexers 264).) Any unused spare word lines and all bad word lines are grounded.

FIG. 4b shows how shifting replacement can be applied to PIA EPROM array 120. The (horizontal) bit line structure is conceptually identical to the (horizontal) bit line structure employed with EPROM array 20 in FIG. 4a. Accordingly, extended discussion of this aspect of FIG. 4b will not be required. It will be sufficient to point out that fuse logics 330 are the functional equivalent of fuse logics 230 and 232, multiplexers 334 are the functional equivalent of multiplexers 234, and multiplexers 344 are the functional equivalent of multiplexers 44 and 46. Similarly, the (vertical) word line structure associated with PIA EPROM array 120 in FIG. 4b is conceptually identical to the (vertical) word line structure associated with EPROM array 20 in FIG. 4a, with elements 362, 364, and 370 being respectively the functional equivalents of elements 262, 264, and 270.

From the foregoing it will be seen that all the areas for which direct replacement of bad circuit groups is provided in FIG. 1 have shifting replacement of bad circuit groups in FIG. 4. Moreover, in all cases in both embodiments, once the chip has been preprogrammed to replace the bad circuit groups, all necessary signal rerouting is thereafter done automatically during both program mode and normal operation mode, and the end user of the chip need not concern himself with it in any respect.

Although direct replacement is used exclusively in FIG. 1 and shifting replacement is used exclusively in FIG. 4, it will be apparent to those skilled in the art that these two techniques can be employed in any desired combination. In FIG. 4, for example, direct replacement could be used for the (horizontal) bit lines in PIA EPROM array 120 and the corresponding portion of the (vertical) word lines in EPROM array 20. This would allow some elements such as multiplexers 264 and 344 to be eliminated.

FIG. 5 shows fuse logics of the type which can be used in controlling direct replacement such as is shown in FIG. 1. If none of the regular circuits associated with this logic is bad, then none of fuses 430a, 430b, 430c, etc., and 431 in the spare circuit fuse logic will be interrupted ("blown"). (In FIG. 5 and subsequent FIGS., symbols like 401 represent N-channel transistors, symbols like 402 represent P-channel transistors, symbols like 403 represent depletion type transistors, and symbols like 430 and 431 represent fuses.) Also, none of the fuses 432 in any of the regular circuit fuse logics will be blown. (The conventional NORMOPN signal is high during program mode and low during normal operation mode. The NORMOP signal is the complement of NORMOPN signal.) This prevents any slection or enabling signal from being applied to the spare circuit during either program mode or normal operation mode, and allows the regular circuit to be appropriately selected during both program mode and normal operation mode. On the other hand, if one of the regular circuits is bad, then the fuse 432 in the regular fuse logic for that circuit is blown, and so are the corresponding fuses 430 and 431 in the spare fuse logic. This prevents the bad regular circuit from being selected during either program mode or normal operation mode and causes the spare circuit to be selected in lieu of the bad regular circuit.

Fuse logic circuits similar to those shown in FIG. 5 can be used wherever direct replacement is to be employed (e.g., for fuse logics 62, 64, 66, 72, 74, 76, 130, 132, 162, and 172). For example, FIG. 6 shows a representative word line fuse logic 62 or 64 and an associated spare word line fuse logic 72 or 74. Fuse 462 is intact if the depicted regular word line pair is to be used, and fuse 472 is intact if the depicted spare word line pair is not to be used. This enables the NOR gates in the depicted regular word line fuse logic and cuts off the associated N-channel transistors in the spare fuse logic. On the other hand, if the spare word line pair is to be used in place of the depicted regular word line pair, fuses 462 and 472 are both blown. This disables the NOR gates in the regular word line fuse logic, enables the associated N-channel transistors in the spare word line fuse logic, and also enables the NOR gates in the spare word line fuse logic, thereby diverting the regular word line signals to the spare word line pair. Similarly, FIG. 7 shows representative word line fuse logic 66 and associated spare word line fuse logic 76. Word lie fuse logic 66 is similar to word line fuse logic 62 or 64 in FIG. 6. Fuse 466 is intact unless the associated regular word line pair is not to be used, and fuse 476 is intact unless the associated spare word line pair is to be used.

Figure 8:
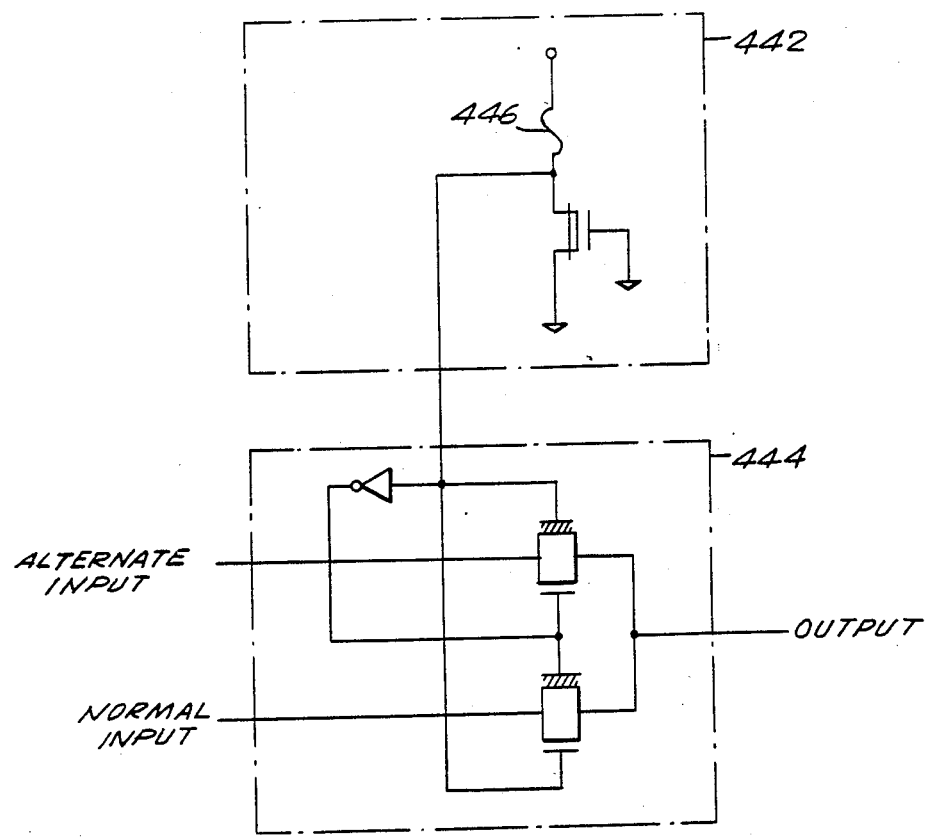
FIG. 8 is a schematic diagram of circuits which can be used to implement portions of the embodiments of FIGS. 1 and 4.

FIG. 8 shows the combination of a simple fuse circuit 442 and a multiplexer circuit 444 which can be used wherever a multiplexer is required to implement either direct replacement (as in FIG. 1) or shifting replacement (as in FIG. 4 . (Note that the direction of information flow in multiplexer 444 can be reversed so that the alternate and regular inputs become alternate and regular outputs, respectively, and so that the output becomes the input.) For example, multiplexer 444 can be used for any of multiplexers 44 or 46 in FIG. 1a (with the control signal coming from one of fuse logics 32 rather than from fuse circuit 442) or any of multiplexers 44, 46, 234, 264, 334, 344, or 364 in FIG. 4 (with the control signal coming from the source indicated in that FIG. ). Fuse logics such as 230, 232, 262, 330, and 362 can be similar to fuse logic 442. Continuing with FIG. 8, when the control signal applied to multiplexer 444 is high (fuse 446 intact), the normal input signal is applied to the output and the alternate input signal is blocked. On the other hand, when the control signal applied to multiplexer 444 is low (fuse 446 blown), the alternate input is applied to the output and the normal input signal is blocked.

We claim:

1. A programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said programmable logic device comprising:

preprogrammable means associated with each of the conductors in at least one of said pluralities of conductors for producing an output indication of whether or not the associated conductor is to be used; and signal diverting means responsive to an output indication from said preprogrammable means that a particular conductor is not to be used for diverting the signals associated with said particular conductor to another conductor in the same plurality;

wherein the plurality of conductors with which said preprogrammable means is associated includes a spare conductor for use in the event that one of the conductors in the same plurality, which are referred to as regular conductors, is not to be used, wherein said regular conductors are disposed in an ordered sequence on said programmable logic device, and wherein said signal diverting means comprises;

means responsive to an output indication from said preprogrammable means that a particular regular conductor is not to be used for shifting the signals associated with said particular regular conductor and any regular conductors to one side of said particular regular conductor in said ordered sequence to the corresponding next adjacent regular conductor in the direction of said shifting, the last of the shifted signals being diverted from the last of said regular conductors to said spare conductor.

2. The programmable logic device defined in claim 1 wherein said spare conductor is disposed after the end of said ordered sequence in the direction of said shifting.

3. A programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said programmable logic device comprising:

preprogrammable means associated with each of the conductors in at least one of said plurality of conductors for producing an output indication of whether or not the associated conductor is to be used; and signal diverting means responsive to an output indication from said preprogrammable means that a particular conductor is not to be used for diverting the signals associated with said particular conductor to another conductor in the same plurality;

wherein said device has (1) a program mode in which selected interconnections between said first and second conductors are established by applying selection signals to the first and second conductors to be interconnected, and (2) a normal operation mode in which input data signals are applied to said first conductors to produce output data signals on said second conductors, and wherein said signal diverting means diverts both the selection signals and the data signals associated with said particular conductor to another conductor in the same plurality.

4. A programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said programmable logic device comprising:

preprogrammable means associated with each of the conductors in at least one of said pluralities of conductors for producing an output indication of whether or not the associated conductor is to be used; and signal diverting means responsive to an output indication from said preprogrammable means that a particular conductor is not to be used for diverting the signals associated with said particular conductor to another conductor in the same plurality;

wherein said second conductors are grouped into a plurality of groups, wherein said programmable logic device includes means for logically combining the signals on at least some of the second conductors in each group to produce a further signal which is a logical function of the combined signals, wherein said preprogrammable means is associated with said second conductors and produces an output indication of whether or not any of said second conductors in each group and the means for logically combining associated with that group is not to be used, and wherein said signal diverting means is associated with said second conductors an responds to an output indication from said preprogrammable means that particular group and the associated means for logically combining are not to be used by diverting the signals associated with all of the second conductors in said particular group to another group.

5. The programmable logic device defined in claim 4 wherein said signal diverting means comprises:

means for substituting said further signal of said another group for said further signal of said particular group.

6. The programmable logic device defined in claim 4 wherein said groups include a spare group for use in the event that one of the other groups, which are referred to as regular groups, is not to be used, and wherein said signal diverting means comprises:

means responsive to an output indication from said preprogrammable means that any of said second conductors in a particular regular group and the means for logically combining associated with that group are not to be used for diverting the signals associated with all of the second conductors in said particular regular group to said spare group.

7. The programmable logic device defined in claim 4 wherein said groups include a spare group for use in the event that one of the other groups, which are referred to as regular groups, is not to be used, wherein said regular conductors are disposed in an ordered sequence on said programmable logic device, and wherein said signal diverting means comprises:

means responsive to an output indication from said preprogrammable means that any of said second conductors in a particular regular group and the means for logically combining associated with that group are not to be used fore shifting the signals associated with all of the second conductors in said particular regular group and any regular groups to one side of said particular regular group in said ordered sequence to the next adjacent regular group in the direction of said shifting, the signals for the last of the shifted regular groups being shifted to said spare group.

8. The programmable logic device defined in claim 7 wherein said spare group is disposed after the end of said ordered sequence in the direction of said shifting.

9. The programmable logic array device defined in claim 4 further comprising:
- a plurality of first signal leads;
- a plurality of second signal leads, each of which is programmably interconnectable to any one of said first leads;
- second preprogrammable means associated with each of the leads in at least one of said pluralities of leads for producing an output indication of whether or not the associated lead is to be used;
- second signal diverting means responsive to an output indication from said second preprogrammable means that a particular lead is not to be used for diverting the signals associated with said particular lead to another lead in the same plurality; and
- means for selectively applying each of at least some of said further signals to a respective one of said first leads.

10. A programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said programmable logic device comprising:
- preprogrammable means associated with each of the conductors in at least one of said pluralities of conductors for producing an output indication of whether or not the associated conductor is to be used; and
- signal diverting means responsive to an output indication from said preprogrammable means that a particular conductor is not to be used for diverting the signals associated with said particular conductor to another conductor in the same plurality;
- wherein said preprogrammable means comprises a device selected from the group consisting of an EPROM, an EEPROM, a fuse, and an antifuse.

11. A programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said programmable logic device comprising:
- preprogrammable means associated with each of the conductors in at least one of said pluralities of conductors for producing an output indication of whether or not the associated conductors is to be used; and
- signal diverting means responsive to an output indication from said preprogrammable means that a particular conductor is not to be used for diverting the signals associated with said particular conductor to another conductor in the same plurality;
- wherein said preprogrammable means comprises opto-thermally alterable means.

12. A programmable logic device having a plurality of first conductors and a plurality of second conductors, each of said second conductors being programmably interconnectable to each of said first conductors for producing on each of said second conductors a signal which is a logical function of the signals on the first conductors to which said second conductors is interconnected, said programmable logic device comprising:
- preprogrammable means associated with each of the conductors in at least one of said pluralities of conductors for producing an output indication of whether or not the associated conductor is to be used;
- signal diverting means responsive to an output indication from said preprogrammable means that a particular conductor is not to be used for diverting the signals associated with said particular conductor to another conductor in the same plurality;
- a plurality of first signal leads;
- a plurality of second signal leads, each of which is programmably interconnectable to any one of said first signal leads;
- second preprogrammable means associated with each of the leads in at least one of said plurality of leads for producing an output indication of whether or not the associated lead is to be used;
- second signal diverting means responsive to an output indication from said second preprogrammable means that a particular lead is not to be used for diverting the signals associated with said particular lead to another lead in the same plurality; and
- means for selectively applying the signal on each of at least some of said second leads to a respective one of said first conductors.

13. The programmable logic device defined in claim 12 further comprising:
- means for selectively applying the signal on each of at least some of said second leads to a respective one of said first conductors.

14. The method of operating a programmable logic device having a plurality of first conductors and a plurality of second conductors, each of said second conductors being programmably interconnectable to each of said first conductors for producing on each of said second conductors a signal which is a logical function of the signals on the first conductors to which said second conductor is interconnected, said method comprising the steps of:
- determining whether or not any one of the conductors in at least one of said pluralities of conductors is not to be used;
- if any particular conductor is not to be used as determined in the preceding step, then modifying said device so that the signals associated with said particular conductor are diverted to another conductor in the same plurality; and
- selectively applying programming signals to said first and second conductors of the modified device to selectively interconnect said first and second conductors and thereby program the device, any programming signals associated with said particular conductor being automatically diverted to said another conductor in the same plurality.

15. The method defined in claim 14 further comprising the step of:
- selectively applying input data signals to said first conductors of the programmed modified device to produce output data signals on said second conductors, any data signals associated with said particular conductor being automatically diverted to said another conductor in the same plurality.

* * * * *

UNITED STATES PATENT AND TRADEMARK OFFICE
CERTIFICATE OF CORRECTION

PATENT NO. : 4,899,067
DATED : February 6, 1990
INVENTOR(S) : Hock-Chuen So/Sau-Ching Wong It is certified that error appears in the above-identified patent and that said Letters Patent is hereby corrected as shown below:

| Column | Line | |
|---|---|---|
| Abstract | 9 | Change "in" to --is--. |
| 8 | 16 | After "each." insert a closing parenthesis. |
| 10 | 17 | Before "upper" insert an opening parenthesis. |
| 10 | 41 | Delete the period. |
| 12 | 37 | Change "lie" to --line--. |
| 13 | 25 | Change the semicolon to a colon. |
| 14 | 31 | Change "an" to --and--. |
| 15 | 57 | Change "conductors" to --conductor--. |

Signed and Sealed this

Seventeenth Day of August, 1993

*Attest:*

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 4,899,067
DATED : February 6, 1990
INVENTOR(S) : Hock-Chuen So and Sau-Ching Wong It is certified that error appears in the above-indentified patent and that said Letters Patent is hereby corrected as shown below:

On the title page, the following additional documents should be listed under <u>References Cited</u>:

U.S. PATENT DOCUMENTS

```
3,566,153  2/71   Spencer            307/205
4,124,899  11/78  Birkner et al.     364/716
4,609,986  9/86   Hartmann et al.    364/200
4,617,479  10/86  Hartmann et al.    307/465
4,677,318  6/87   Veenstra           307/465
4,703,206  10/87  Cavlan             307/465
4,713,792  12/87  Hartmann et al.    364/900
```

OTHER DOCUMENTS

C.-L. Wey et al., "On the Design of a Redundant Programmable Logic Array (RPLA)," <u>IEEE Journal of Solid-State Circuits</u>, Vol SC-22, No. 1, Feb. 1987, pp. 114-17.

Signed and Sealed this

Twentieth Day of September, 1994

Attest:

BRUCE LEHMAN

Attesting Officer       Commissioner of Patents and Trademarks